United States Patent
Merz et al.

(10) Patent No.: US 9,155,188 B2
(45) Date of Patent: Oct. 6, 2015

(54) ELECTROMAGNETIC INTERFERENCE SHIELDING TECHNIQUES

(71) Applicant: Apple Inc., Cupertino, CA (US)

(72) Inventors: Nicholas G. Merz, San Francisco, CA (US); Hong Wang, Cupertino, CA (US); Michael M. Nikkhoo, Saratoga, CA (US); Dennis R. Pyper, Cupertino, CA (US); Christopher Matthew Werner, San Jose, CA (US)

(73) Assignee: Apple Inc., Cupertino, CA (US)

( * ) Notice: Subject to any disclaimer, the term of this patent is extended or adjusted under 35 U.S.C. 154(b) by 33 days.

(21) Appl. No.: 13/631,156

(22) Filed: Sep. 28, 2012

(65) Prior Publication Data

US 2013/0114228 A1    May 9, 2013

Related U.S. Application Data

(60) Provisional application No. 61/556,152, filed on Nov. 4, 2011.

(51) Int. Cl.
*H05K 9/00* (2006.01)
*H05K 1/02* (2006.01)
*H05K 3/28* (2006.01)

(52) U.S. Cl.
CPC ............. *H05K 1/0218* (2013.01); *H05K 3/284* (2013.01); *H05K 2201/0317* (2013.01); *H05K 2201/09618* (2013.01); *H05K 2201/09872* (2013.01); *H05K 2201/09909* (2013.01); *H05K 2201/10371* (2013.01); *H05K 2201/2018* (2013.01); *Y10T 29/4913* (2015.01); *Y10T 29/49146* (2015.01)

(58) Field of Classification Search
CPC .................................. H05K 9/00; H01L 23/02
USPC ................. 361/783, 816, 818, 600, 799, 800; 257/660, 686, 777, E23.114, E25.013, 257/E25.021, E25.027; 29/412, 825, 829, 29/832, 841
See application file for complete search history.

(56) References Cited

U.S. PATENT DOCUMENTS

| | | | |
|---|---|---|---|
| 6,483,719 B1 | 11/2002 | Bachman | |
| 6,674,652 B2 | 1/2004 | Forte et al. | |
| 7,129,571 B2 * | 10/2006 | Kang | 257/678 |
| 7,202,422 B2 * | 4/2007 | Ogatsu | 174/373 |

(Continued)

FOREIGN PATENT DOCUMENTS

| | | |
|---|---|---|
| EP | 2161974 | 3/2010 |
| JP | 2010080699 | 4/2010 |

(Continued)

*Primary Examiner* — Courtney Smith
*Assistant Examiner* — Rashen E Morrison
(74) *Attorney, Agent, or Firm* — Joseph F. Guihan

(57) ABSTRACT

Methods and apparatuses are disclosed for fabricating a printed circuit board (PCB) having electromagnetic interference (EMI) shielding and also having reduced volume over conventional frame-and-shield approaches. Some embodiments include fabricating the PCB by mounting an integrated circuit to the PCB, outlining an area corresponding to the integrated circuit with a number of grounded vias, selectively applying an insulating layer over the PCB such that at least one of the grounded vias are exposed, and selectively applying a conductive layer over the PCB such that the conductive layer covers at least a portion of the integrated circuit and such that the conductive layer is coupled to the at least one of the grounded vias that are exposed.

17 Claims, 16 Drawing Sheets

(56) References Cited

U.S. PATENT DOCUMENTS

| | | |
|---|---|---|
| 8,102,032 B1 | 1/2012 | Bolognia et al. |
| 8,258,411 B2 | 9/2012 | Wang et al. |
| 8,276,268 B2 | 10/2012 | Kapusta et al. |
| 2002/0129951 A1 | 9/2002 | Babb et al. |
| 2005/0162841 A1 | 7/2005 | Ogatsu |
| 2007/0138614 A1* | 6/2007 | Harrison et al. ............ 257/686 |
| 2007/0210082 A1* | 9/2007 | English et al. ............ 220/4.21 |
| 2009/0194322 A1* | 8/2009 | Usui et al. ............ 174/260 |
| 2010/0001390 A1* | 1/2010 | Lee et al. ............ 257/686 |
| 2010/0199492 A1* | 8/2010 | Hiner et al. ............ 29/846 |
| 2011/0180933 A1 | 7/2011 | Inoue et al. |

FOREIGN PATENT DOCUMENTS

| | | |
|---|---|---|
| WO | 2009003018 | 12/2008 |
| WO | 2010100864 | 9/2010 |

* cited by examiner

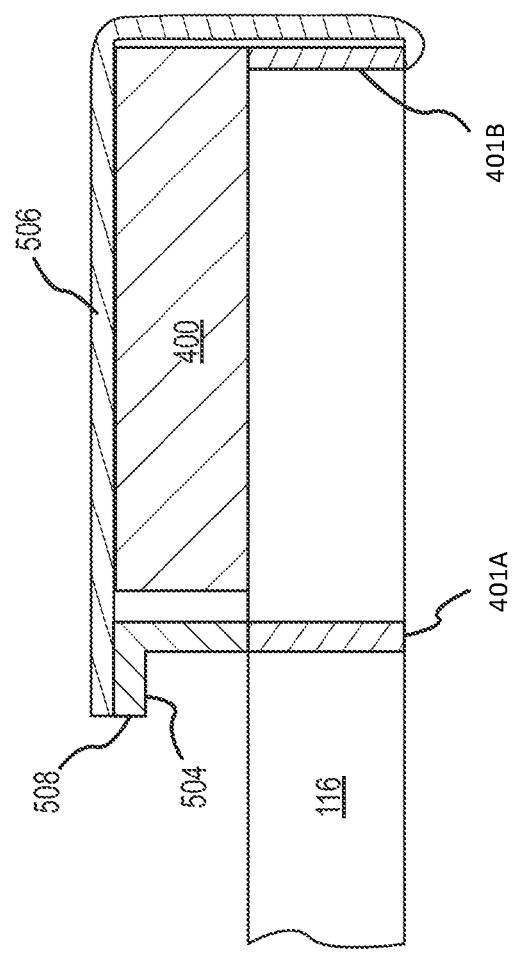

600

700

ELECTROMAGNETIC INTERFERENCE SHIELDING TECHNIQUES

CROSS-REFERENCE

This application claims the benefit of prior filed U.S. Provisional Patent Application No. 61/556,152, filed Nov. 4, 2011, which is incorporated by reference herein in its entirety.

BACKGROUND

I. Technical Field

The present invention relates generally to electromagnetic interference (EMI) shielding, and more particularly, EMI shielding techniques that reduce the overall amount of space consumed and that offer substantially the same EMI protection as conventional shielding techniques.

II. Background Discussion

Electronic devices are ubiquitous in society and can be found in everything from portable cell phones to wristwatches. Many of these electronic devices either emit electromagnetic interference (EMI) to their surroundings, or are exposed to EMI through their surroundings. Because government regulations often stipulate the amount of EMI that these electronic devices are allowed to emit, the designers of these electronic devices often employ techniques to minimize the amount of EMI emitted from the circuitry within the electronic devices. Additionally, because it is potentially harmful to the circuitry within the electronic devices to be exposed to EMI, the designers of these electronic devices often employ techniques to minimize the amount of EMI to which these electronic devices are exposed. Using EMI shielding techniques, designers minimize both the amount of EMI emitted by and the amount of EMI to which these devices are exposed.

Conventional EMI shielding techniques, sometimes referred to as "frame-and-shield" approaches, often involve encasing circuitry of the electronic device within a metallic structure. The circuitry being encased is mounted, along with other circuitry, on a printed circuit board (PCB). In the frame-and-shield approach, first a metallic frame or "fence" is mounted to the PCB around the periphery of the circuitry that is to be shielded, and then a metallic shield is snap-fit to this fence. While this frame-and-shield approach may limit both the amount of EMI emitted by the circuitry and the amount of EMI to which this circuitry is exposed down to acceptable levels, it also consumes a great deal of space laterally on the PCB and a great deal of space vertically within the electronic device (i.e., in the Z-direction that is generally perpendicular to the surface of the PCB.) This problem is only made worse when the electronic devices have circuitry that is mounted on both sides of the PCB. For example, many portable electronic devices have circuitry located on both the top and bottom of the PCB, and thus, vertical space consumed by EMI shielding techniques is effectively doubled. Accordingly, EMI shielding techniques that reduce the overall amount of space consumed and that offer substantially the same EMI protection as conventional shielding techniques are desirable.

SUMMARY

Methods and apparatuses are disclosed for fabricating a printed circuit board (PCB) having electromagnetic interference (EMI) shielding and also having reduced volume over conventional frame-and-shield approaches.

In some embodiments, there may be provided a method that may include mounting a first integrated circuit to a first surface of a circuit board, and providing at least a first electrical pad on the first surface of the circuit board adjacent to the first integrated circuit. After the mounting and after the providing, the method may also include selectively applying an insulating layer on the first surface of the circuit board about at least a portion of the periphery of the first integrated circuit while leaving the first electrical pad exposed. After the selectively applying the insulating layer, the method may also include selectively applying a conductive layer that covers at least a portion of the first integrated circuit and that is electrically coupled to the exposed first electrical pad. For example, in some embodiments, the method may also include mounting a second integrated circuit to the circuit board, where the insulating and conductive layers may be conformally applied to the first integrated circuit and not the second integrated circuit. For example, in some other embodiments, the method may also include mounting a second integrated circuit to a second surface of the circuit board, where the insulating and conductive layers may be conformally applied to both the first and second integrated circuits. For example, in some embodiments, the method may also include mounting a fence to the circuit board, where the selectively applying the conductive layer may include mounting the conductive layer to the fence. In some particular embodiments, such a fence may be mounted to the second surface of the circuit board. For example, in some embodiments, the method may also include mounting first and second discrete components to the circuit board, where the insulating and conductive layers may be conformally applied to the first discrete component and not the second discrete component. For example, in some embodiments, the method may also include mounting a first fence to the first surface of the circuit board and mounting a second fence to a second surface of the circuit board, where the selectively applying the conductive layer may include applying the conductive layer between a pedestal of the first fence and a pedestal of the second fence. For example, in some other embodiments, the method may also include mounting a fence to the first surface of the circuit board, where the selectively applying the conductive layer may include applying the conductive layer between a pedestal of the fence and a second electrical pad, and the second electrical pad may be on a second surface of the circuit board. For example, in some embodiments, the method may also include, before the selectively applying the insulating layer, masking the first electrical pad and/or providing a barrier on the first surface of the circuit board between the first integrated circuit and the first electrical pad.

In some other embodiments, there may be provided an apparatus that may include a circuit board having a first surface and a second surface, a first integrated circuit coupled to the first surface of the circuit board, a first pad on the first surface of the circuit board adjacent the first integrated circuit, a second pad on one of the first surface of the circuit board and the second surface of the circuit board, and a conductive layer, where the conductive layer is electrically coupled to the first pad, the conductive layer is electrically coupled to the second pad, and the conductive layer covers at least a portion of the first integrated circuit. For example, in some embodiments, the conductive layer may be electrically coupled to the second pad on the first surface of the circuit board adjacent the first integrated circuit. For example, in some other embodiments, the conductive layer may be electrically coupled to the second pad on the second surface of the circuit board, where the first surface may be a top surface of the circuit board and the second surface may be a bottom surface of the circuit board, and/or where the conductive layer may be electrically coupled to the second pad at a first position on the second surface of the circuit board, the first position on the second surface of the circuit board may be directly under a first position on the first surface of the circuit board, and a portion of the first integrated circuit may be positioned on the first position on the first surface of the circuit board. Additionally or alternatively, the conductive layer may wrap around a side of the first integrated circuit and may wrap around a side of the circuit board that may extend between the first surface of the circuit board and the second surface of the circuit board. For example, in some embodiments, the first pad may be electrically coupled to an electrical ground of the circuit board and the second pad may be electrically coupled to the electrical ground of the circuit board. For example, in some embodiments, a first fence may be electrically coupled to the first pad, where the conductive layer may be electrically coupled to the first pad via the first fence, and a second fence may be electrically coupled to the second pad, where the conductive layer may be electrically coupled to the second pad via the second fence. For example, in some embodiments, a second integrated circuit may be coupled to the second surface of the circuit board, where the second pad may be on the second surface of the circuit board, and where the conductive layer may cover at least a portion of the second integrated circuit, and/or where the conductive layer may wrap around a side of the first integrated circuit, around a side of the circuit board that extends between the first surface of the circuit board and the second surface of the circuit board, and around a side of the second integrated circuit. For example, in some embodiments, a first fence may be electrically coupled to the first pad and a second fence may be electrically coupled to the second pad, where the conductive layer may be electrically coupled to the first pad via the first fence and to the second pad via the second fence.

In yet some other embodiments, there may be provided a method that may include mounting a first integrated circuit to a first surface of a circuit board, electrically coupling a conductive layer to a first pad on the first surface of the circuit board adjacent the first integrated circuit, and electrically coupling the conductive layer to a second pad on one of the first surface of the circuit board and a second surface of the circuit board for shielding at least a portion of the first integrated circuit with the conductive layer. For example, in some embodiments, the conductive layer is electrically coupled to the second pad on the second surface of the circuit board, where the conductive layer wraps around a side of the first integrated circuit and around a side of the circuit board that extends between the first surface of the circuit board and the second surface of the circuit board. Alternatively or additionally, in some embodiments, the method may also include mounting a second integrated circuit to the second surface of the circuit board, where the conductive layer may shield at least a portion of the second integrated circuit, and/or where the conductive layer may wrap around a side of the first integrated circuit, around a side of the circuit board that extends between the first surface of the circuit board and the second surface of the circuit board, and around a side of the second integrated circuit. For example, in some embodiments, the method may also include electrically coupling a first fence to the first pad and electrically coupling a second fence to the second pad, where the conductive layer may be electrically coupled to the first pad via the first fence and the conductive layer may be electrically coupled to the second pad via the second fence.

BRIEF DESCRIPTION OF THE DRAWINGS

FIGS. 5A-5E illustrate the integrated circuit with an EMI shield according to several different embodiments.

The use of the same reference numerals in different drawings may indicate similar or identical items.

DETAILED DESCRIPTION OF THE INVENTION

Methods and apparatuses are disclosed for fabricating a printed circuit board (PCB) having electromagnetic interference (EMI) shielding and also having reduced volume over conventional frame-and-shield approaches. Some embodiments include fabricating the PCB by mounting an integrated circuit to the PCB, outlining an area corresponding to the integrated circuit with a number of grounded vias, selectively applying an insulating layer over the PCB such that at least one of the grounded vias are exposed, and selectively applying a conductive layer over the PCB such that the conductive layer covers at least a portion of the integrated circuit and such that the conductive layer is coupled to the at least one of the grounded vias that are exposed.

Although one or more of the embodiments disclosed herein may be described in detail with reference to a particular electronic device, the embodiments should not be interpreted or otherwise used as limiting the scope of the disclosure, including the claims. In addition, one skilled in the art will understand that the following description has broad application. For example, while embodiments disclosed herein may focus on certain portable electronic devices, such as cell phones, it should be appreciated that the concepts disclosed herein equally apply to other portable electronic devices with EMI shielding needs where smaller form factors are desirable. For example, the concepts disclosed herein may be employed in wristwatches, calculators, and/or music players, to name but a few. In addition, it should be appreciated that the concepts disclosed herein may equally apply to non-portable electronic devices, such as desktop computers or televisions. Accordingly, the discussion of any embodiment is meant only to be exemplary and is not intended to suggest that the scope of the disclosure, including the claims, is limited to these embodiments.

Figure 1A:
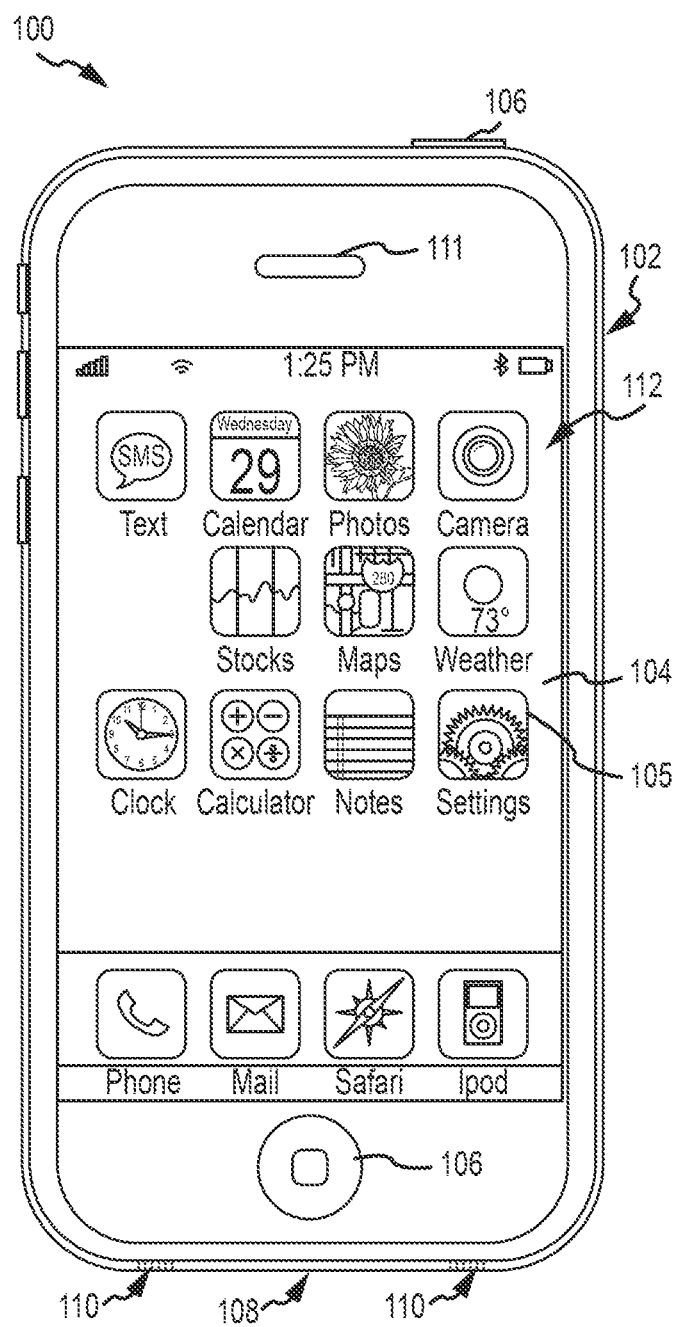
FIG. 1A depicts an electronic device.

FIG. 1A depicts an electronic device 100 in accordance with one embodiment. In some embodiments, the electronic device 100 may be a media player for playing music and/or video, a cellular phone, a personal data organizer, or any combination thereof. Thus, the electronic device 100 may be a unified device providing any one of or a combination of the functionality of a media player, a cellular phone, a personal data organizer, and so forth. In addition, the device 100 may allow a user to connect to and communicate through the Internet or through other networks, such as local or wide area networks. For example, the electronic device 100 may allow a user to communicate using e-mail, text messaging, instant messaging, or using other forms of electronic communication. By way of example, the electronic device 100 may be a model of an iPod® having a display screen or an iPhone® available from Apple Inc. of Cupertino, Calif.

In the illustrated embodiment, the electronic device 100 includes an enclosure 102, a display 104, user input structures 106, and input/output ports 108. The enclosure 102 may be formed from plastic, metal, composite materials, or other suitable materials or any combination thereof. The enclosure 102 may protect the interior circuitry of the electronic device 100 from physical damage, and also may shield the interior circuitry from electromagnetic interference (EMI). Additional EMI shielding techniques that reduce the overall volume of the electronic device 100 are discussed in more detail below.

The display 104 may be a liquid crystal display (LCD) or may be a light emitting diode (LED) based display, an organic LED based display, or other suitable display. In accordance with certain embodiments of the present technique, the display 104 may display a user interface 112 as well as various images 105, such as logos, avatars, photos, album art, and so forth. Additionally, in one embodiment, the display 104 may be a touch screen through which a user may interact with the user interface. The display 104 also may display various function and/or system indicators to provide feedback to a user, such as power status, call status, memory status, etc. These indicators may be incorporated into the user interface displayed on the display 104. As discussed herein, in certain embodiments, the user interface 112 may be displayed on the display 104, and may provide a way for a user to interact with the electronic device 100. The user interface may be a textual user interface, a graphical user interface (GUI), or any combination thereof, and may include various layers, windows, screens, templates, elements or other components that may be displayed in just a portion or in all areas of the display 104.

In one embodiment, one or more of the user input structures 106 are configured to control the device 100, such as by controlling a mode of operation, an output level, an output type, etc. For instance, the user input structures 106 may include a button to turn the device 100 on or off. In general, embodiments of the electronic device 100 may include any number of user input structures 106, including buttons, switches, a control pad, keys, knobs, a scroll wheel, or any other suitable input structures. The input structures 106 may work with a user interface displayed on the device 100 to control functions of the device 100 or of other devices connected to or used by the device 100. For example, the user input structures 106 may allow a user to navigate a displayed user interface or to return such a displayed user interface to a default or home screen.

The user interface 112 may, in certain embodiments, allow a user to interface with displayed interface elements via the one or more user input structures 106 and/or via a touch sensitive implementation of the display 104. In such embodiments, the user interface 112 provides interactive functionality, allowing a user to select, by touch screen or other input structure, from among options displayed on the display 104. Thus the user can operate the device 100 by appropriate interaction with the user interface 112. The user interface 112 may be any suitable design to allow interaction between a user and the device 100. Thus, the user interface 112 may provide windows, menus, graphics, text, keyboards or numeric keypads, scrolling devices, or any other elements. In one embodiment, the user interface 112 may include screens, templates, and user interface components, and may include or be divided into any number of these or other elements. The arrangement of the elements of user interface 112 may be hierarchical, such that a screen includes one or more templates, where the template includes one or more user interface components. It should be appreciated that other embodiments may arrange user interface elements in any hierarchical or non-hierarchical structure.

The electronic device 100 may also include various input and output ports 108 to allow connection of additional devices. For example, a port 108 may be a headphone jack that provides for connection of headphones. Additionally, a port 108 may have both input/output capabilities to provide for connection of a headset (e.g. a headphone and microphone combination). Embodiments may include any number of input and/or output ports, including headphone and headset jacks, universal serial bus (USB) ports, Firewire (IEEE-1394) ports, subscriber identity module (SIM) card slots, and AC and/or DC power connectors. Further, the device 100 may use the input and output ports to connect to and send or receive data with any other device, such as other portable electronic devices, personal computers, printers, etc. For example, in one embodiment the electronic device 100 may connect to a personal computer via a Firewire (IEEE-1394) connection to send and receive data files, such as media files. In still other embodiments, the ports 108 may be used to provide power to charge internal batteries within the electronic device 100.

The electronic device 100 may also include various audio input and output portions 110 and 11 respectively. For example, an input receiver 110 may be a microphone that receives user audio input. Embodiments of the input receiver 110 may include coil-and-magnet microphones, condenser microphones, carbon microphones, ribbon microphones, micro-electrical mechanical system (MEMS) microphones, or any combination thereof. An output transmitter 111 may be a speaker that transmits audio signals to a user. In some embodiments, the input receiver 110 and output transmitter 111 may be the same physical device having dual functionality. For example, in the embodiments where the input receiver 110 is a coil-and-magnet type microphone, the output transmitter 111 may be achieved by operating the coil-and-magnet in reverse as a speaker and vice versa.

Figure 1B:
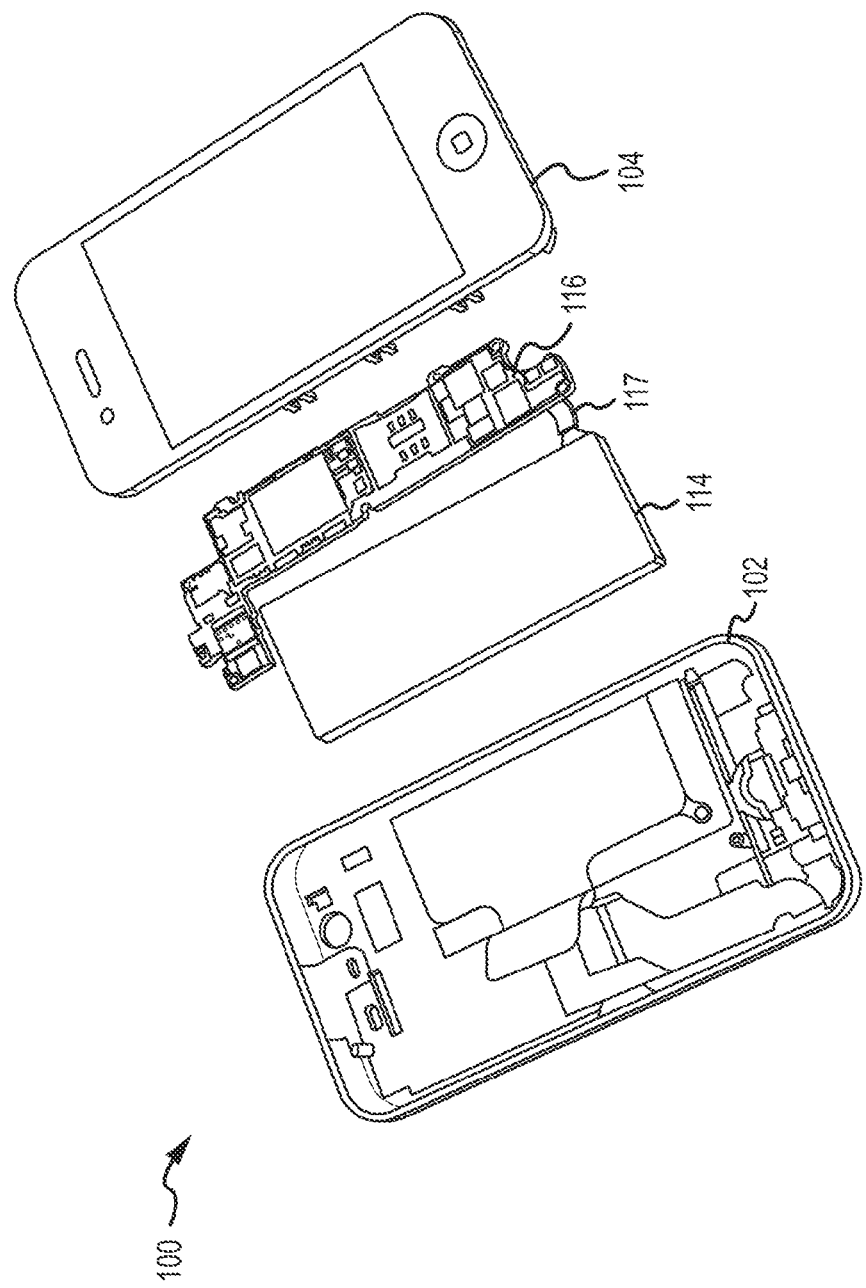
FIG. 1B illustrates the electronic device of FIG. 1A in exploded view.

FIG. 1B illustrates the electronic device 100 embodied in FIG. 1A in exploded view. It should be appreciated that the embodiment of the electronic device 100 shown in FIG. 1B is merely illustrative, and that for the sake of discussion, many components contained within the enclosure 102 are not specifically shown in FIG. 1B. Referring now to FIG. 1B, the enclosure 102 houses a battery 114 coupled to a printed circuit board (PCB) 116 via a connector 117. The battery 114 provides electrical power to circuitry located on the printed circuit board 116. The battery 114 may be a rechargeable or replaceable battery, and in any event, such battery-powered implementations may be highly portable, allowing a user to carry the electronic device 100 while traveling, working, exercising, and so forth.

In this manner, a user of the electronic device 100, depending on the functionalities provided by the electronic device 100, may listen to music, play games or video, record video or take pictures, place and take telephone calls, communicate with others, control other devices (e.g., the electronic device 100 may include remote control and/or Bluetooth functionality), and so forth while moving freely with the electronic device 100. In addition, in certain embodiments, the electronic device 100 may be sized such that it fits relatively easily into a pocket or hand of the user. In such embodiments, the electronic device 100 is relatively small and easily handled and utilized by its user and thus may be taken practically anywhere the user travels. The PCB 116 includes many of the circuits used to carry out the functionality of the electronic device 100. In order to keep the overall size of the electronic device 100 to a minimum, the lateral and vertical spacing of the circuitry integrated onto the PCB 116 is also kept to a minimum. FIGS. 3A-5E below discuss in greater detail the circuitry integrated onto the PCB 116, their EMI shielding needs, and the difficulties that these EMI shielding needs create in attempting to minimize the size of the electronic device 100.

Figure 2:
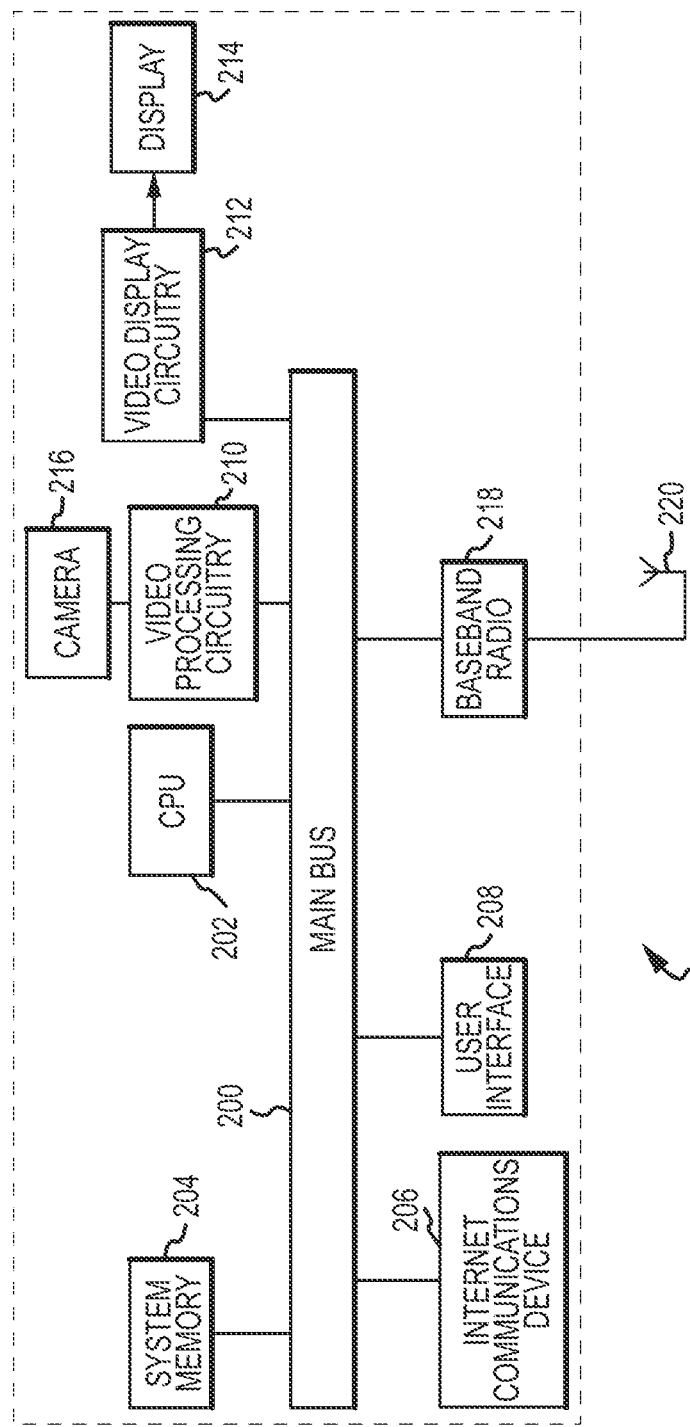
FIG. 2 illustrates a block diagram of circuitry that may be integrated onto a printed circuit board (PCB) within the electronic device.

FIG. 2 illustrates a block diagram of circuitry that may be integrated onto the PCB 116. As shown in FIG. 2, the electronic device 100 may include a main bus 200 to which peripheral electronic components are communicatively coupled. In some embodiments, the main bus 200 may be one of the Advanced Microcontroller Bus Architecture (AMBA®) compliant data buses from ARM Limited.

The electronic device 100 also may include a CPU 202 that is coupled to the main bus 200. The CPU 202 may be any general purpose microprocessor such as a Reduced Instruction Set Computer (RISC) from ARM Limited. The CPU 202 may execute an operating system of the electronic device 100 and manage the various functions of the electronic device 100. As such, it may be coupled to the main bus 200 and configured to transmit instructions to other devices coupled to the main bus 200.

The main bus 200 also may couple to a system memory 204. The system memory 204 may store the operating system and/or other firmware that executes on the electronic device 100. Embodiments of the system memory 204 may include, for example, any type of random access memory (RAM), non-volatile memory devices, such as ROM, EPROM, and EEPROM, NOR or NAND flash memory, but may also include any kind of electronic storage device, such as, for example, magnetic or optical disks or combinations thereof. Additionally, although not specifically shown, the system memory 204 also may include a memory controller that controls the flow of data to and from the system memory 204.

The main bus 200 also may couple to an Internet communications device 206. The Internet communications device 206 may implement various operations for communicating with the Internet. For example, the Internet communications device 206 may include a wireless communications device operating in accordance with Institute of Electrical and Electronics Engineers (IEEE) 802.11 standards or an Ethernet communication device operating in accordance with IEEE 802.3 standards. In some embodiments, the Internet communication device 206 may perform only a portion of the task of communication with the Internet; for example, in some embodiments, the Internet communication device 206 may only be the physical communications link, and the rest of the task of communication with the Internet is performed by software executing on the CPU 202.

The main bus 200 also may couple to a user interface 208. As discussed above with regard to items 106 and 112 of FIG. 1A, the user interface 208 may be embodied as a variety of user interface tools such as, for example, buttons, knobs, touch screens, trackballs, etc.

The main bus 200 also may couple to video components, including video processing circuitry 210, video display circuitry 212, and display 214. The video processing circuitry 210 may be configured to compress video data into various formats and send the compressed video data to other parts of the electronic device 100. For example, the video processing circuitry 210 may be coupled to a camera 216, and the video processing circuitry 210 may process raw image data from the camera 216 into JPEG or MPEG format and then send this compressed video data to the system memory 204 via main bus 200. The video processing circuitry 210 also may be configured to decompress video data of various encoding formats and send the decompressed video data to other parts of the system. For example, the video processing circuitry 210 may be configured to decompress JPEG or MPEG encoded video data obtained from the system memory 204 and then send the decompressed video data to the system memory 204 or the video display circuitry 212.

The video display circuitry 212 may also be configured to generate video data in a wide range of video formats. For example, the video display circuitry 212 may generate an analog signal such as an NTSC compatible signal or a digital signal such as an ATSC or HDMI compatible signal. Furthermore, the display 214 may be any type of video display device, such as, for example, an LCD screen. In some embodiments, the display 214 is an integral part of the electronic device 100; however, in alternate embodiments, the display 214 may be an external device coupled to the electronic device 100 through a data transfer medium such as an HDMI interface, for example.

Together, the video components 210, 212, and 214 may be used to display various forms of video content. For example, the video components 210, 212, and 214 may be used to display the real-time camera view through the camera 216, or still pictures that have been previously recorded and stored. Additionally, the video components 210, 212, and 214 may be used to display the video portion of a media with both audio and video content. For example, the video components 210, 212, and 214 may be used to process and display audio/video media such as electronic games or broadcast media delivered to the electronic device 100 from any possible source, such as, for example, a broadcast television signal, streaming media from the Internet, or an audio/video file stored in the system memory 204.

The main bus 200 also may be coupled to a baseband radio 218 that is further coupled to an antenna 220. In the embodiments where the electronic device 100 is a portable phone, the baseband radio 218 transmits and receives wireless telephone signals via an antenna 220. As the baseband radio 218 that is coupled to the CPU 202, the CPU 202 may directly control various features of the baseband radio 218, such as initiation and termination of incoming or outgoing phone calls. In some embodiments, CPU 202 may transmit and receive data over a wireless telephone data service such that the baseband radio 218 functions similar to the Internet communications device 206.

Between the Internet communications device 206, and the baseband radio 218, the electronic device 100 may be capable of communicating via a wide variety of wireless communication protocols including 3G, global position systems (GPS), global system for mobile communications (GSM), Wi-Fi™, Bluetooth®, etc. Because each of these wireless communication protocols operates at different frequency bands, the overall range of frequencies received and/or transmitted by the Internet communications device 206 and/or baseband radio 218 may vary widely. For example, in the embodiments where the baseband radio 218 implements a Bluetooth wireless protocol, the frequency range used by the baseband radio 218 may be between about 2.402 GHz and about 2.496 GHz. Meanwhile, in the embodiments where the Internet communications device 206 implements a Wi-Fi™ wireless protocol, the frequency range used by the Internet communications device 206 may be between about 5.736 GHz and about 5.834 GHz.

Each of these various operating frequencies of the electronic device 100 may interfere differently with other electronic devices or even with other circuitry within the electronic device 100. For example, the Bluetooth protocol shares the 2.4 GHz industrial, scientific, and medical (ISM) band of frequencies band with other household devices such as cordless telephones and wireless networks, as well as some baby monitors and microwave ovens, and thus, when the electronic device 100 operates in Bluetooth mode, it causes interference with these electronic devices. Also, many of the bands of GSM frequencies (e.g., 702 MHz through 2.0 GHz) interfere with coil-and-magnet speakers and/or microphones that come in close physical proximity to the electronic device 100 or that are in the electronic device itself. Because different portions of the electronic device 100 may have unique interference patterns, embodiments of the PCB 116 (shown in FIG. 1B) are disclosed that implement selective EMI shielding.

Figure 3A:
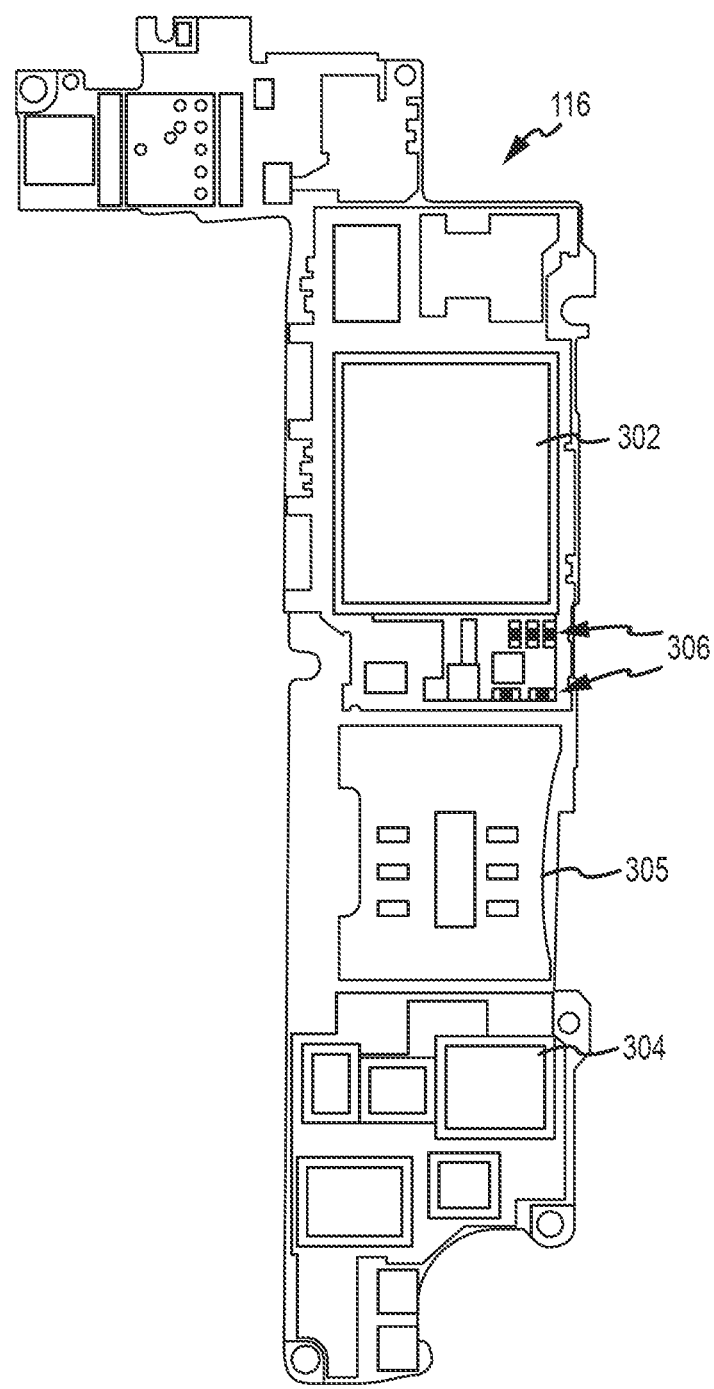
FIGS. 3A and 3B illustrate the front and back sides, respectively, of one embodiment of the PCB.
Figure 3B:
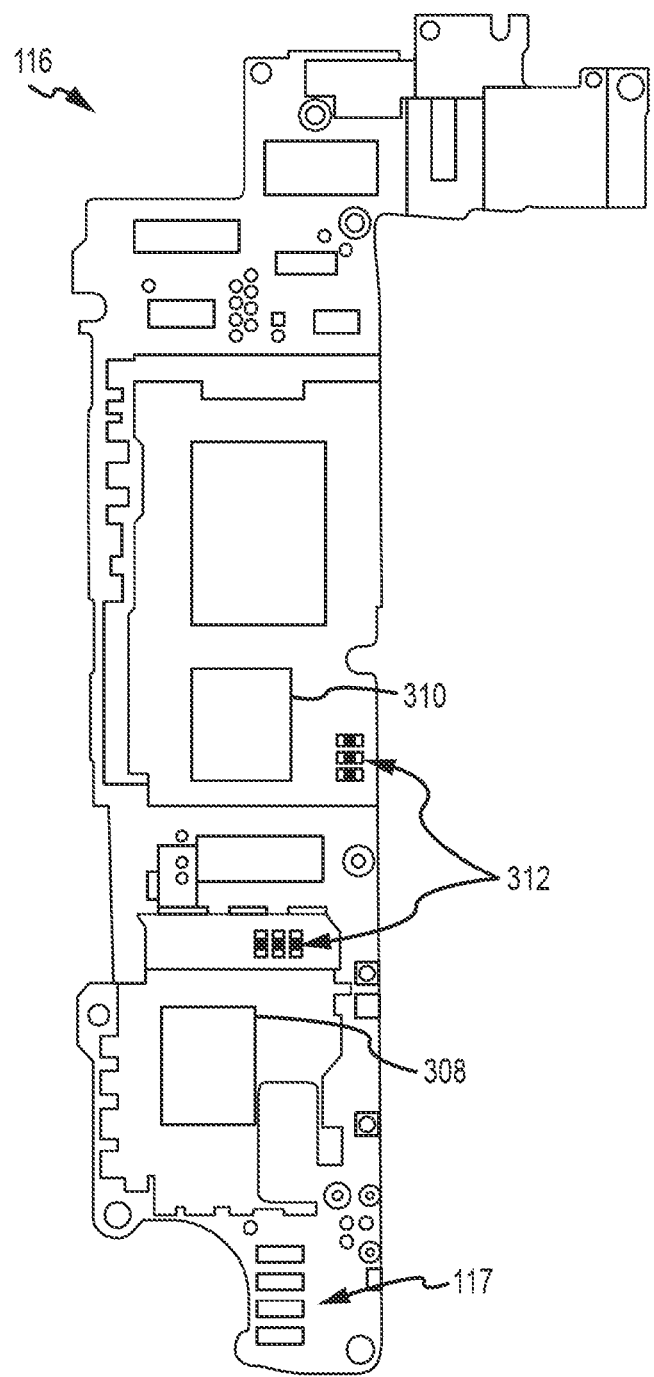

FIGS. 3A and 3B illustrate the front and back sides, respectively, of one embodiment of the PCB 116 shown in FIG. 1B. Referring briefly back to FIG. 1B in conjunction with FIGS. 3A and 3B, it can be appreciated that the overall shape of the PCB 116 is designed such that it fits within the enclosure 102 along with other electrical components, such as the battery 114. Because space within the enclosure is at a premium, circuitry is mounted on both the front and the back sides of the PCB 116 as shown in FIGS. 3A and 3B. The circuitry mounted on the surface of either side of the PCB 116 includes encapsulated integrated circuits as well as discrete electrical components.

For instance, the integrated circuits on the front side (shown in FIG. 3A) may include encapsulated integrated circuits such as a processor 302 and a transceiver 304 (to name only a few), discrete electrical components such as surface mounted resistors and capacitors 306, and connection mechanisms such as a SIM card slot 305. Likewise, the integrated circuits on the back side (show in FIG. 3B) also may include encapsulated integrated circuits such as a cellular data networking chip 308 and a power management chip 310 (to name only a few), discrete electrical components such as surface mounted resistors and capacitors 312, and connection mechanisms such as the battery connector 117 (described above with regard to FIG. 1A). In the illustrated embodiment where the electronic device 100 is an iPhone®, the processor 302 may be an A5 dual core processor from Apple Inc., the transceiver 304 may be an RTR8605 multi-band RF transceiver from Qualcomm Inc., the cellular data networking chip 308 may be a MDM6610 mobile data modem from Qualcomm Inc., and the power management chip 310 may be a PM8028 power management chip from Qualcomm Inc. Of course other embodiments of the electronic device 100 exist and the specific integrated circuits mounted to the front and back sides of the PCB 116 vary with each embodiment.

Each of the circuits mounted to the front and/or back of the PCB 116 may have specific EMI shielding needs, and in order to facilitate portability of the electronic device 100, the volume of the PCB 116 should be kept to a minimum by minimizing lateral and/or vertical spacing of the circuitry mounted to the front and/or back of the PCB 116. FIGS. 4A-5E illustrate multiple EMI shielding techniques for the circuitry mounted to the PCB 116 where the overall volume of the PCB 116 is reduced in the lateral and/or vertical directions. It should be noted that, for the sake of illustration, FIGS. 4A-5E illustrate shielding techniques applied to a single encapsulated integrated circuit. However, the techniques described herein may apply to any of the components within the electronic device 100, such as, unencapsulated integrated circuits, discrete electronic components (such as resistors and capacitors), electrical buses, electrical motors, multiple encapsulated circuits, and so forth. Further, any one of the techniques illustrated in FIGS. 4A-5E may be selectively applied to one of the components mounted to the PCB 116 to the exclusion of others and thereby provide differing amounts of EMI shielding to each component mounted to the PCB 116.

Prior to shielding for EMI purposes, the integrated circuitry may be surrounded with an insulator material. The insulator material may prevent the circuits from coming into contact with moisture, dust, chemicals, and also help to moderate the overall temperature of the integrated circuit. For example, without such an insulator, the surface of the integrated circuit may become contaminated with ionic substances, such as fingerprint residues, that become conductive in the presence of moisture and cause the integrated circuit performance to degrade over time. Additionally, surrounding the integrated circuit with an insulator may provide an additional measure of protection against electrostatic discharge (ESD) over air (i.e., no insulator) because insulators are less susceptible to polarization in the presence of an electric field than air. After the insulator material is applied, a conductor may be applied over the insulator material for EMI shielding.

Figure 4A:
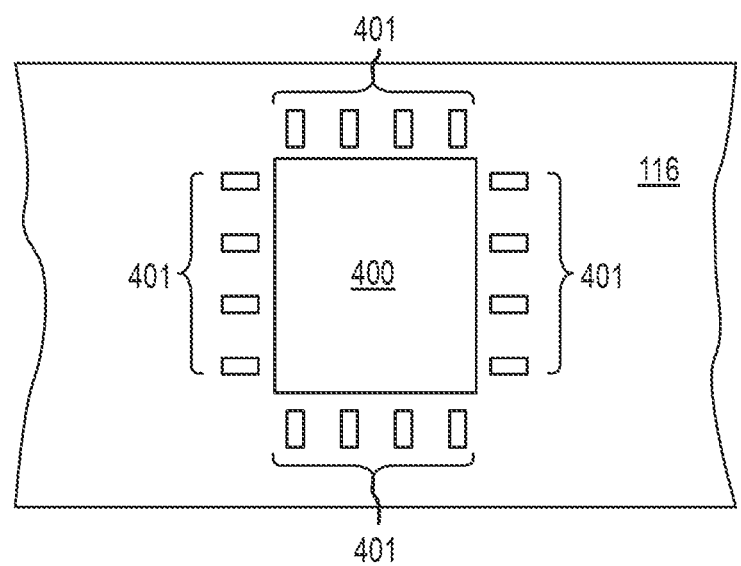
FIG. 4A shows a top down view of an integrated circuit without insulator or conductor materials applied.

FIG. 4A shows a top down view of the integrated circuit 400 without insulator or conductor materials applied. Referring first to FIG. 4A, the integrated circuit 400 may be any one of the integrated circuits described above with regard to FIGS. 3A and 3B. As shown in FIG. 4A, the integrated circuit 400 may be placed on the PCB 116 such that it lies within a lateral area defined by grounding points or pads 401 of the PCB 116. These pads 401 may be connected to electrical ground for the entire PCB 116. For ease of discussion, the top down view of integrated circuit 400 is shown in FIG. 4A with four grounding pads on each side, however, any number of grounding pads may be used in practice.

Figure 4B:
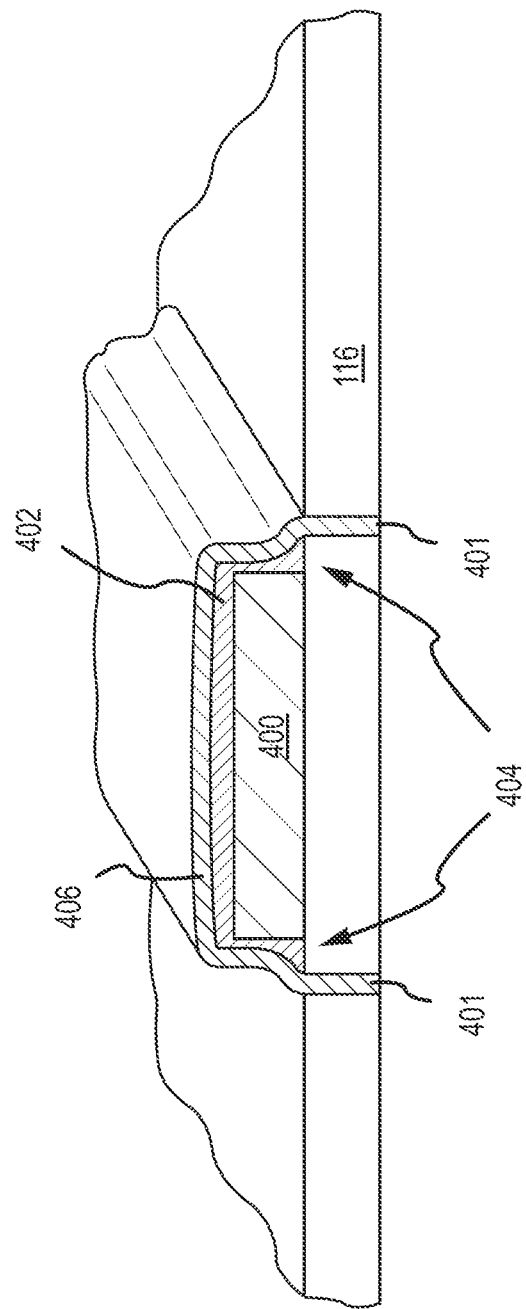
FIG. 4B shows a cross section of the integrated circuit with an insulator conformally disposed about the periphery.

FIG. 4B shows a cross section of the integrated circuit 400 with an insulator 402 conformally disposed about the periphery of the integrated circuit 400 such that it substantially covers the top and sides of the integrated circuit 400. FIG. 4B also shows a conductor 406 conformally disposed about the periphery of the insulator 402 such that it substantially covers the insulator 402 and makes contact with the pads 401. Various methods may be used to apply the insulator 402 to the integrated circuit 400 and various methods may be used to apply the conductor 406 to the insulator 402. Methods that may be used in applying the insulator 402 will be discussed below, and then following this discussion, methods that may be used in applying the conductor 406 will be discussed.

In one embodiment, the insulator 402 may be conformally applied to the integrated circuit 400 using a spray coating machine, such as a PVA2000 available from Precision Valve and Automation or the SL-940E available from Nordson ASYMTEK. Spray coating the insulator 402 may allow it to be conformally applied in a selective fashion, which allows the integrated circuit 400 to be coated with the insulator while leaving the pads 401 or other conductors on the PCB 116 exposed. By allowing the pads 401 or other conductors on the PCB 116 to remain exposed, an EMI shield may be formed and attached to the ground pads 401 when the conductor 406 is applied.

In other embodiments, instead of or in addition to spray coating, a mask may be used to selectively expose the area of the PCB 116 where the integrated circuit 400 are located and cover the area of the PCB 116 where the pads 401 are located. In these embodiments, the masking fixture may be highly accurate and aligned, e.g., within +/−0.2% at the edges of the integrated circuit 400 or any other component to be masked. Further, in these embodiments, the masking fixture may be made of silicone.

The type of conformal insulator used may vary between the embodiments ultimately implemented. In one embodiment, the insulator 402 may be a HumiSeal® brand conformal coating available from Chase Corporation, such as 1A33 and/or UV40-250. In other embodiments, the insulator 402 may be a Hysol® brand conformal coating available from Henkel Corporation, such as PC40-UM or UV7993. These conformal coatings may be used alone or with thinners to vary the coverage that is ultimately obtained.

Referring still to the insulator 402 shown in FIG. 4B, other methods are possible for applying the insulator 402. The insulator 402 may be conformally applied to select portions of the PCB 116 using chemical vapor deposition (CVD) techniques. In some embodiments, the material that is deposited via CVD is parylene-N. Of course, coatings other than parylene-N may be applied, such as parylene-C or parylene-D. The parylene-N coating may provide a hydrophobic coating over selected portions of the PCB 116. Applying parylene-N with CVD may include first applying a mask to non-conductive areas of the PCB 116, such as pads 401 or conductive striplines. In some embodiments, this masking may occur using dispensed silicone. Certain components on the PCB 116 may present difficulties to proper masking. For example, referring briefly back to FIGS. 1B and 3B, connector 117 may be difficult to properly mask. In these embodiments, the PCB 116 may be prepared to include one or more preformed silicone plugs that act as masks for the connectors 117. These preformed silicone plugs may be attached to the PCB 116 at the same time that the connectors 117 are soldered to the surface of the PCB 116. In addition, the SIM card slot 305 shown in FIG. 3A may be difficult to mask and a dummy card may be inserted into the slot 305 to act as a mask. Regardless of the masking steps used prior to the application of parylene-N, as was the case with the masking that takes place for the conformal spray coating described above, masking prior to application of the parylene-N allows the pads 401 or other conductive areas of the PCB 116 to be preserved for later connection to an EMI shield.

Referring again to FIG. 4B, with the mask in place, one or more substances may be applied to the insulator 402 to promote adhesion of the parylene-N. For example, in some embodiments, Silane, such as Silquest manufactured by Momentive A-174NT, may be applied as an adhesion promoter after masking and prior to application of the parylene-N.

After the adhesion promoter is applied, the parylene-N may be conformally applied via CVD to the surfaces left exposed by the masking steps, such as the top and sides of the integrated circuit 400 and certain unmasked portions of the PCB 116 (indicated in FIG. 4B by pedestals 404). In some embodiments, a thickness of approximately 4.5 to 4.9 μm may be achieved, thereby substantially reducing the vertical spacing of the resultant EMI shield. In the embodiments where the PCB 116 is manufactured to include preformed silicone plugs over the connector 117 and/or the slot 305, they may be removed after the application of the parylene-N via CVD.

Figure 4C:
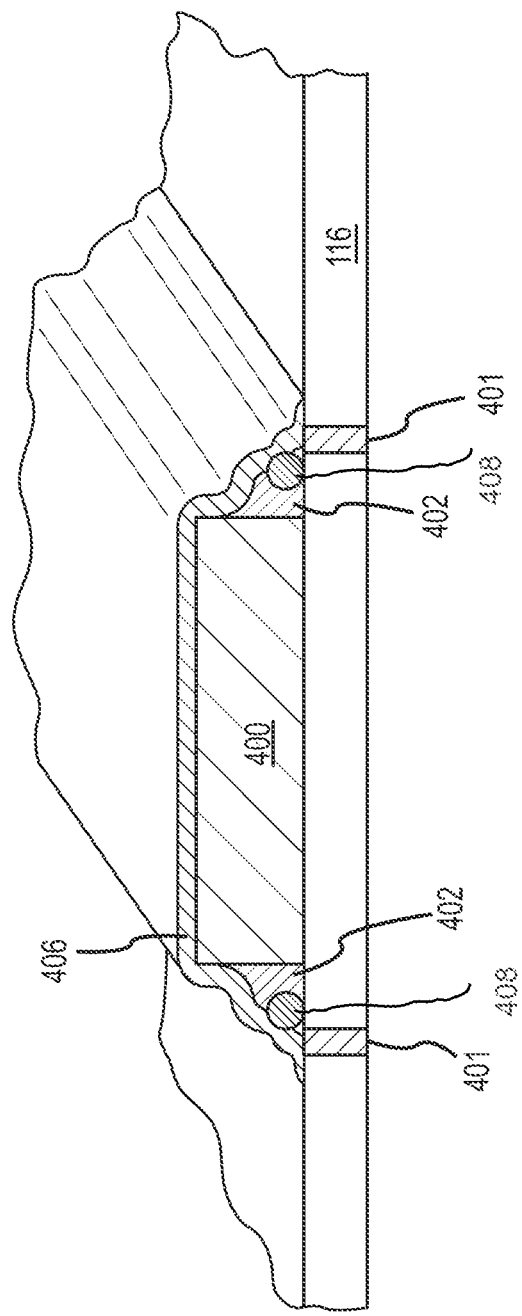
FIG. 4C illustrates an alternate embodiment for applying the insulator.

FIG. 4C illustrates an alternate embodiment for applying the insulator 402. Referring to FIG. 4C, the insulator 402 is selectively applied to the sides of the integrated circuit 400 rather than the top of the integrated circuit 400. This may reduce the vertical space consumed by shielding the integrated circuit 400 because there is no insulator 402 present on the top of the integrated circuit 400. Thus, the vertical space consumed by the embodiment of the EMI shield shown in FIG. 4C is generally less than the vertical space consumed by the embodiment shown in FIG. 4B.

As shown in FIG. 4C, the insulator 402 may be dispensed between the integrated circuit 400 and a barrier or dam 408. The dam 408 may be placed just inside the pads 401 so as to create a substantially continuous barrier to retain the insulator 402. In some embodiments, the gap between the integrated circuit 400 and the pads 401 is about 1.2 mm. The material used in forming the dam 408 may include various epoxies or acrylics, such as Loctite® 3705, Hysol® E01072, and Hysol® UV9060 all from Henkel, or Vitralit® 1671 from Panacol. The material used in forming the insulator 402 also may vary, and in some embodiments includes Loctite® 3311 and/or Hysol® 1061, both available from Henkel. The dam 408 may be formed using a dispenser from Speedline Technologies, such as the FX-D. In these embodiments, the dam 408 may be formed in several layers that are built up over successive applications of the dam material.

Referring to FIGS. 4B and 4C, methods for applying the conductor 406 will now be discussed. By selectively applying the insulator 402 so that pads 401 remain exposed, the conductor 406 may be applied to the pads 401 during application to the insulator 402 or to the top of the integrated circuit 400. Since the pads 401 are connected to ground, the combination of the pads 401 and the conductor 406 may form a shield that protects the integrated circuit 400 from ambient EMI and also may protect other components on the PCB 116 that are adjacent to the integrated circuit 400 from EMI generated by the integrated circuit 400.

The type of material used in forming the conductor 406 may vary based upon the embodiment ultimately implemented. In some embodiments, the conductor 406 may be applied using a physical vapor deposition (PVD) technique where the conductor 406 is a combination of chromium and copper. For example, in one embodiment where PVD is used, the conductor 406 may be formed by depositing a first chromium layer at 100 nm thickness, followed by a layer of copper at 350 nm thickness, and then followed by a second chromium layer at 100 nm thickness. In some embodiments, a plasma pre-treatment may be used to promote adhesion to the insulator 402. For example, in one embodiment, an argon plasma may be used prior to applying the first chromium layer.

Referring still to the conductor 406 shown in FIGS. 4B and 4C, some embodiments may dispose the conductor 406 about the insulator 402 as an ink based conductor. For example, some embodiments may use a conductive ink that may be applied to the insulator 402 using ink jet technology. Commercially available inks include CCI-300 from Cabot Conductive Ink, which is comprised of ultra-fine silver particles engineered to form a low resistivity conductor. Other techniques for applying ink based conductors over the surface of the insulator 402 include dispensing metallic inks with a dispensing system. For example, a UV cured silver flake ink, like PD-004A from Henkel, may be dispensed over the insulator 402 using an air assist dispensing machine, such as the S-900 dispensing machine available from Nordson ASYMTEK.

In the ink based embodiments, the conductor 406 can be custom applied so as to form a specific structure. For example, if the integrated circuit 400 has portions that are particularly noisy, then the conductor 406 may be thicker in these areas or formed into a specific shape of shielding to counteract this noisy portion of the integrated circuit 400.

Custom application of the conductor 406 also may allow the conductor 406 to be made into a shield that is aesthetically pleasing in addition to being an EMI shield, e.g., displaying a logo in the shield. In some embodiments, prior to the ink jet deposition, the insulator 402 may be treated with an UV ozone treatment to provide for adequate wetting of the conductor 406. Other embodiments may include pre-treating the insulator 402 with a plasma.

Figure 4D:
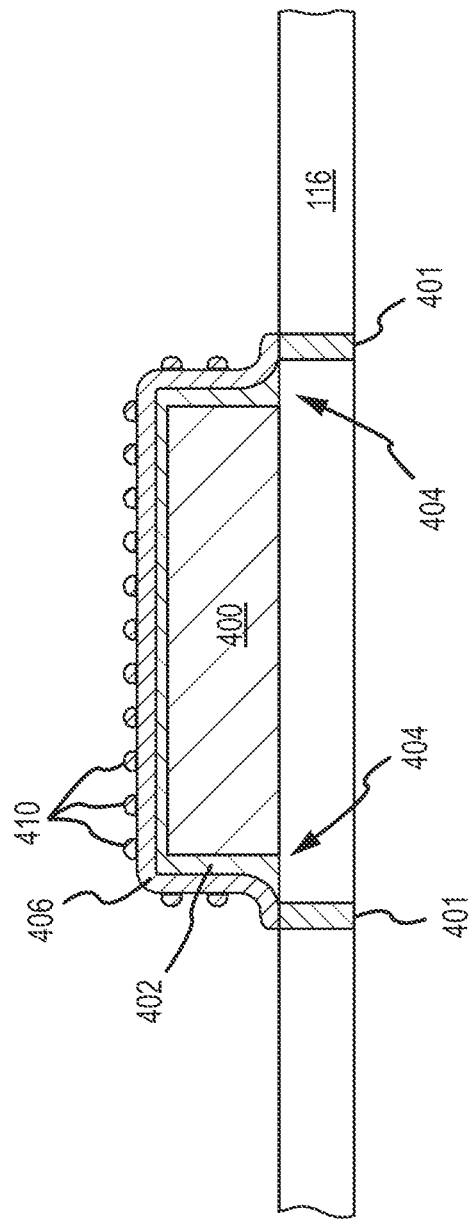
FIG. 4D illustrates an alternate embodiment of a conductor dispensed about the insulator.

FIG. 4D illustrates an alternate embodiment of the conductor 406 dispensed about the insulator 402. As shown, the conductor 406 may be dispensed in a grid having ridges 410. The material used to form the ridges 410 may be a metallic epoxy material, such as silver or copper based epoxies. In some embodiments, the conductor 406 may be dispensed using standard dispensing systems, such as the FX-D dispensing system mentioned above from Speedline Technologies. These dispensing methods may be used to vary the pitch and diameter of ridges 410. For example, in some embodiments, the ridges 410 may be approximately 75 μm wide and spaced apart by about 200 μm. Akin to ink based conductors, dispensed epoxy conductors may be dispensed so they are formed into a specific shape of shielding to counteract this noisy portion of the integrated circuit 400 or formed into aesthetically appealing patterns or logos.

Figure 5A:
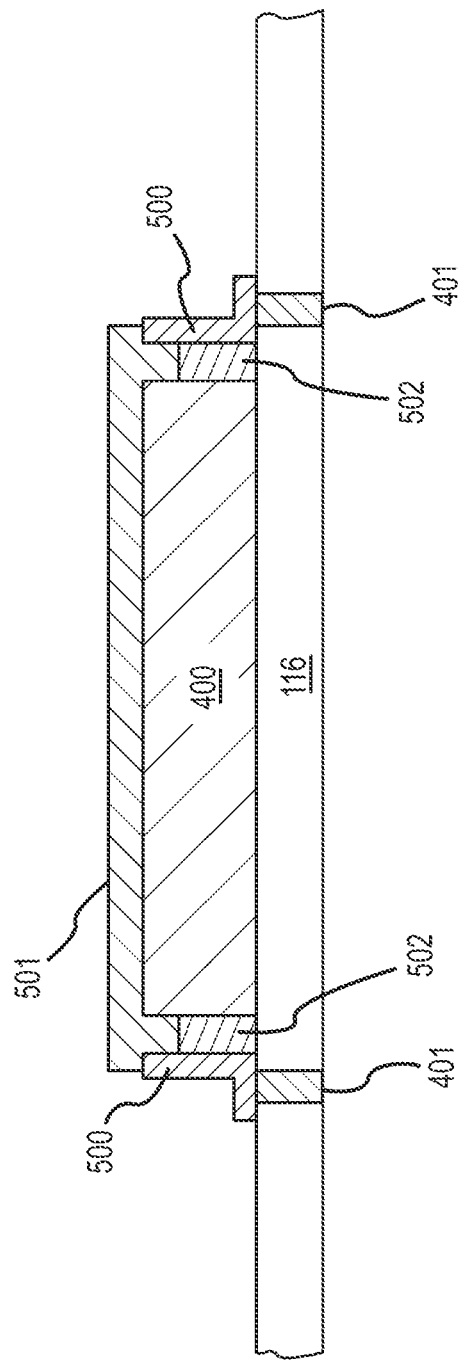
Figure 5B:
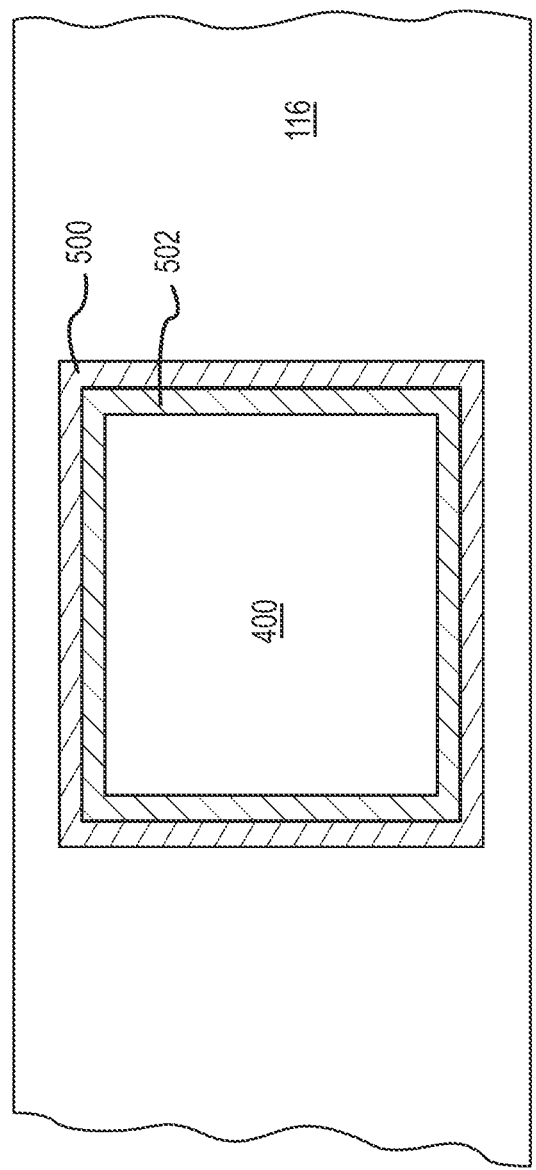

FIGS. 5A-5E illustrate the integrated circuit 400 with an EMI shield according to several different embodiments. Referring first to FIG. 5A, the integrated circuit 400 is shown mounted to the PCB 116 within the lateral area defined by the pads 401. A frame or fence 500 may be coupled to the pads 401 and run about the lateral periphery of the integrated circuit 400. FIG. 5B shows a top down view of the integrated circuit 400 mounted to the PCB 116 with a fence 500 around the periphery of the integrated circuit 400. Referring to FIG. 5A, a conductor 501 is shown mounted to the top of the fence 500, such that conductor 501 may be electrically coupled to at least one of the pads 401 via fence 500 (e.g., fence 500 may be electrically coupled to a pad 401 and conductor 501 may be electrically coupled to fence 500). FIG. 5B shows the top down view of the integrated circuit 400 without the conductor 501 mounted to the fence 500. The conductor 501 may be the same type of materials described above with regard to the conductor 406. In some embodiments, the conductor 501 is a foil such as SF-P3100 foil from Tatsuto.

The fence 500 may be metal or a metallic composite. Various schemes are possible for mounting the conductor 501 to the fence 500. For example, in some embodiments, the conductor 501 is soldered to the top of the fence 500 either manually or with a hotbar solder technique. As shown in FIG. 5A, the fence 500 may couple to the ground pads 401 so that the combination of the fence 500, conductor 501 and pads 401 comprise an EMI shield.

In some embodiments, the overall height of the fence 500 is less than or equal to the height of the integrated circuit 400 so that the vertical space consumed by the shielded integrated circuit is substantially equal to the thickness of the integrated circuit 400 plus the thickness of the conductor 501. Further, the width of the fence 500 may vary between embodiments. For example, in some embodiments the width of the fence 500 is approximately 0.75 mm to allow for adequate contact between the conductor 501 and the fence 500. Although the fence 500 is shown as continuous, other embodiments are possible where the fence 500 includes gaps. In the embodiments where the fence 500 is continuous, the gap between the integrated circuit 400 and the fence 500 may be substantially filled with an insulator 502. Insulator 502 may be the same types of materials described above with regard to insulator 402.

Figure 5D:
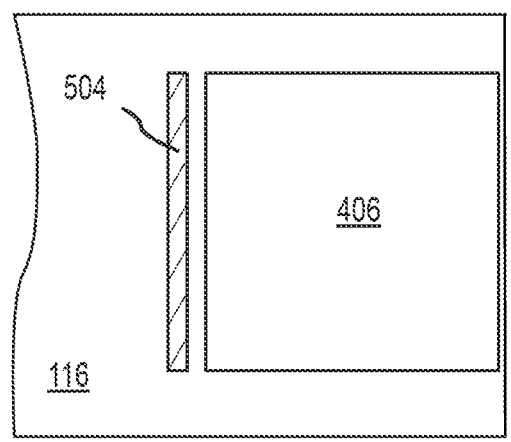

FIG. 5C illustrates an alternate embodiment for the configuration of a fence 504 and a conductor 506. FIG. 5D illustrates the alternate embodiment of FIG. 5C prior to applying the conductor 506. Referring to the embodiment shown in FIGS. 5C and 5D, the fence 504 couples to a first pad 401A on a front side or top surface of PCB 116 and is oriented such that a pedestal 508 portion of the fence 504 is facing in a direction away from the integrated circuit 400. The pedestal 508 couples to the conductor 506 and the conductor 506 wraps around the integrated circuit 400 to make contact with a second pad 401B on the reverse side of the PCB 116 (e.g., the back side or bottom surface of PCB 116). In some embodiments, as shown in FIG. 5C, conductor 506 wraps down around and along a side of integrated circuit 400 and wraps down around and along a side of PCB 116 (e.g., a side of PCB 116 extending between the top surface and the bottom surface of PCB 116). Thus, the conductor 506 forms an EMI shield by coupling to ground through both pads 401A and 401B as shown in FIG. 5C. The second pad 401B may be positioned directly under integrated circuit 400, as shown in FIG. 5C, and, in some embodiments, a portion of integrated circuit 400 may be electrically coupled to a portion of the second pad 401B on the front side or top surface of PCB 116 while conductor 506 may be electrically coupled to a portion of the second pad 401B on the back side or bottom surface of PCB 116. The pedestal 508 may be positioned below the top of the integrated circuit 400 so that the EMI shield formed by the conductor 506 has minimal vertical space requirements—i.e., only the thickness of the integrated circuit 400 and the conductor 506 in the illustrated embodiment. The EMI shield also may have minimum lateral space requirements for several reasons. First, since the pedestal 508 faces away from the integrated circuit 400, the fence 504 may be placed closer to the integrated circuit 400, thereby saving lateral area. For instance, if the pedestal 508 faced the integrated circuit 400, then either the integrated circuit 400 would have to have a shorter vertical profile to accommodate the pedestal 508, or the integrated circuit 400 would need to be spaced farther away from the fence 504, thereby consuming greater lateral space. Second, because the opposite fence may be eliminated in favor of mounting the conductor 506 directly to the pad 401B on the reverse side of the PCB 116, the lateral space consumed by the fence may be eliminated.

The type of material used in forming the conductor 506 may vary based upon the embodiment ultimately implemented. In some embodiments, the conductor 506 may be metallic foil based conductive films such as AL-10S or CU-10S both from 3M. Further, in some embodiments, a water sensor (not specifically shown) may be integrated into the conductor 506 to measure if the PCB 116 is exposed to water.

Figure 5E:
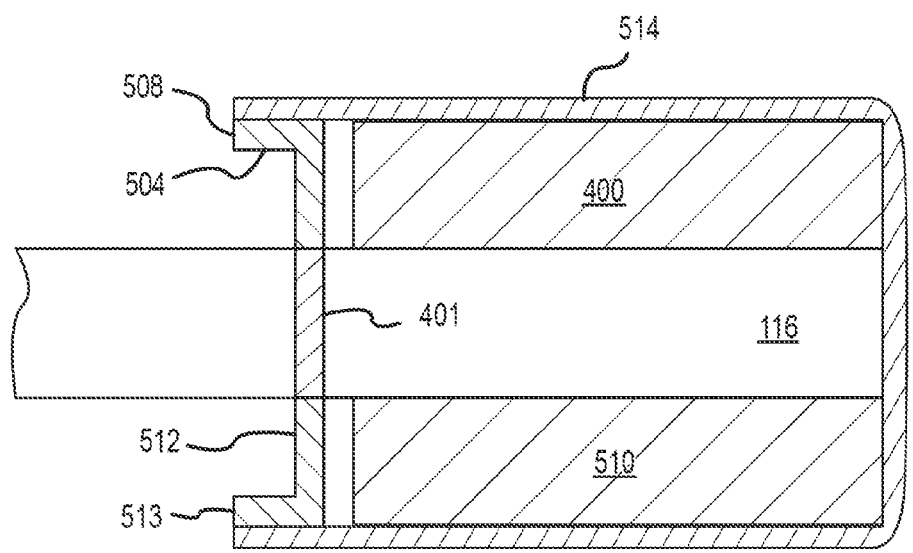

FIG. 5E shows an alternate embodiment illustrating the two-sided nature of the PCB 116. Referring to FIG. 5E, in addition to integrated circuit 400, there may be an integrated circuit 510 mounted to the reverse side of the PCB 116. Also, in addition to the fence 504 that may be electrically coupled to a first pad 401 on a front side or top surface of PCB 116, there may be a fence 512 mounted to the reverse side of the PCB 116 (e.g., the back side or bottom surface of PCB 116). Fence 512 may be mounted to and/or electrically coupled to a second pad 401 on the reverse side of the PCB 116. As shown in FIG. 5E, fence 504 and fence 512 may be mounted on and/or electrically coupled to the same pad 401 at opposite sides of PCB 116. Although in other embodiments, each one of fence 504 and fence 512 may be mounted on and/or electrically coupled to its own distinct pad 401 on opposite sides of PCB 116. As shown in the illustrated embodiment, the fence 512 may have a pedestal 513 that faces in a direction away from the integrated circuit 510. A conductor 514 may be mounted to (e.g., electrically coupled to) the pedestal 508 and wrap all the way around and mount to (e.g., electrically couple to) the pedestal 513.

Figure 6:
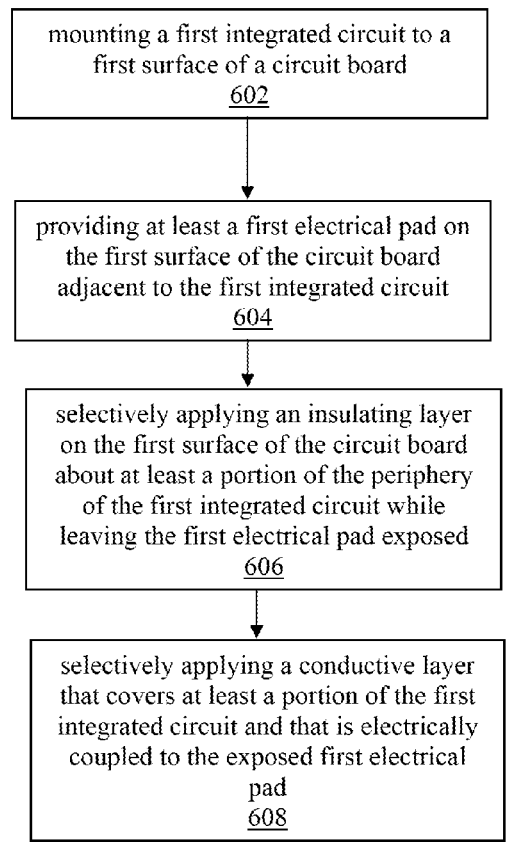
FIGS. 6 and 7 are flowcharts of illustrative processes for shielding an integrated circuit, in accordance with some embodiments.

FIG. 6 is a flowchart of an illustrative process 600, which may include mounting a first integrated circuit to a first surface of a circuit board at step 602. At step 604, process 600 may include providing at least a first electrical pad on the first surface of the circuit board adjacent to the first integrated circuit. Next, after step 602 and after step 604, process 600 may include selectively applying an insulating layer on the first surface of the circuit board about at least a portion of the periphery of the first integrated circuit while leaving the first electrical pad exposed at step 606. For example, as described with respect to FIGS. 4A-4D, insulator 402 may be applied to PCB 116 while at least one pad 401 may be exposed. After step 606, process 600 may include selectively applying a conductive layer that covers at least a portion of the first integrated circuit and that is electrically coupled to the exposed first electrical pad at step 608. For example, as described with respect to FIGS. 4B-4D, conductor 406 may be applied to cover at least a portion of integrated circuit 400 and may be electrically coupled to at least one exposed pad 401.

It is understood that the steps shown in process 600 of FIG. 6 are merely illustrative and that existing steps may be modified or omitted, additional steps may be added, and the order of certain steps may be altered.

Figure 7:
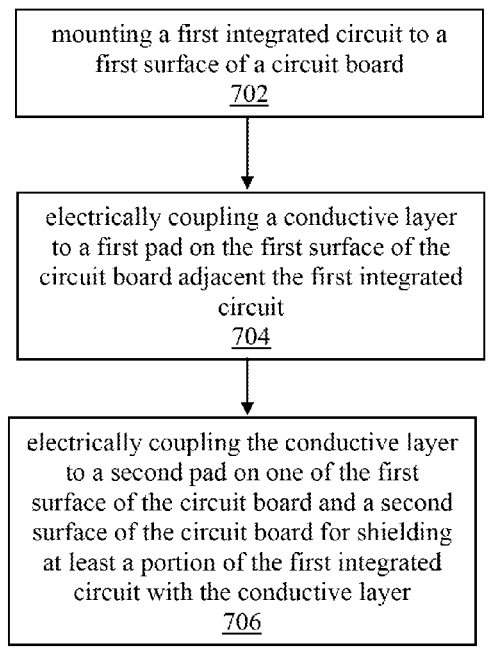

FIG. 7 is a flowchart of an illustrative process 700, which may include mounting a first integrated circuit to a first surface of a circuit board at step 702. Process 700 may also include electrically coupling a conductive layer to a first pad on the first surface of the circuit board adjacent the first integrated circuit at step 704. Process 700 may also include electrically coupling the conductive layer to a second pad on one of the first surface of the circuit board and a second surface of the circuit board for shielding at least a portion of the first integrated circuit with the conductive layer at step 706. For example, as shown in FIGS. 4A and 4B, a conductor 406 may be electrically coupled to a first pad 401 and a second pad 401 for shielding at least a portion of integrated circuit 400.

It is understood that the steps shown in process 700 of FIG. 7 are merely illustrative and that existing steps may be modified or omitted, additional steps may be added, and the order of certain steps may be altered.

While there have been described systems and methods for shielding integrated circuits, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up" and "down," "front" and "back," "top" and "bottom" and "side," "length" and "width" and "thickness," "X-" and "Y-" and "Z-," and the like may be used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention.

Therefore, those skilled in the art will appreciate that the invention can be practiced by other than the described embodiments, which are presented for purposes of illustration rather than of limitation.

What is claimed is:

1. An apparatus comprising:
    a circuit board comprising a first surface and a second surface;
    a first integrated circuit coupled to the first surface of the circuit board;
    a first pad on the first surface of the circuit board adjacent the first integrated circuit;
    a second pad on one of the first surface of the circuit board and the second surface of the circuit board;
    a conductive layer, wherein the conductive layer is electrically coupled to the first pad, wherein the conductive layer is electrically coupled to the second pad, and wherein the conductive layer covers at least a portion of the first integrated circuit; and
    a fence electrically coupled to the first pad, wherein the conductive layer is electrically coupled to the first pad via the fence, wherein the fence has a top surface, wherein the integrated circuit has a top surface, and wherein the conductive layer has a planar portion that is in direct contact with the top surface of the fence and the top surface of the integrated circuit.

2. The apparatus of claim 1, wherein the conductive layer is electrically coupled to a second pad on the first surface of the circuit board adjacent the first integrated circuit.

3. The apparatus of claim 1, wherein the conductive layer is electrically coupled to a second pad on the second surface of the circuit board.

4. The apparatus of claim 3, wherein:
    the first surface is a top surface of the circuit board; and
    the second surface is a bottom surface of the circuit board.

5. The apparatus of claim 3, wherein:
    the conductive layer is electrically coupled to the second pad at a first position on the second surface of the circuit board;
    the first position on the second surface of the circuit board is directly under a first position on the first surface of the circuit board; and
    a portion of the first integrated circuit is positioned on the first position on the first surface of the circuit board.

6. The apparatus of claim 3, wherein:
    the conductive layer wraps around a side of the first integrated circuit; and
    the conductive layer wraps around a side of the circuit board that extends between the first surface of the circuit board and the second surface of the circuit board.

7. The apparatus of claim 1, wherein:
    the first pad is electrically coupled to an electrical ground of the circuit board; and
    the second pad is electrically coupled to the electrical ground of the circuit board.

8. The apparatus of claim 1, further comprising an additional fence electrically coupled to the second pad, wherein the conductive layer is electrically coupled to the second pad via the additional fence.

9. The apparatus of claim 1, further comprising a second integrated circuit coupled to the second surface of the circuit board, wherein the second pad is on the second surface of the circuit board.

10. The apparatus of claim 1, wherein the conductive layer covers at least a portion of the second integrated circuit.

11. The apparatus of claim 9, wherein: the conductive layer wraps around a side of the first integrated circuit;
the conductive layer wraps around a side of the circuit board that extends between the
first surface of the circuit board and the second surface of the circuit board; and
the conductive layer wraps around a side of the second integrated circuit.

12. The apparatus of claim 9, further comprising:
an additional fence electrically coupled to the second pad, wherein:
the conductive layer is electrically coupled to the first pad via the fence; and
the conductive layer is electrically coupled to the second pad via the additional fence.

13. A method comprising:
mounting an integrated circuit to a first surface of a circuit board;
mounting a fence to a first pad on the first surface of the circuit board adjacent the integrated circuit, wherein the fence is electrically coupled to the first pad,
electrically coupling a conductive layer to the first pad on the first surface of the circuit board via the fence, wherein the fence has a top surface, wherein the integrated circuit has a top surface, and wherein the conductive layer has a planar portion that is in direct contact with the top surface of the fence and the top surface of the integrated circuit; and
electrically coupling the conductive layer to a second pad on one of the first surface of the circuit board and a second surface of the circuit board for shielding at least a portion of the integrated circuit with the conductive layer.

14. The method of claim 13, wherein the conductive layer is electrically coupled to the second pad on the second surface of the circuit board.

15. The method of claim 14, wherein:
the conductive layer wraps around a side of the integrated circuit; and
the conductive layer wraps around a side of the circuit board that extends between the first surface of the circuit board and the second surface of the circuit board.

16. The method of claim 14, further comprising:
electrically coupling a second fence to the second pad, wherein:
the conductive layer is electrically coupled to the second pad via the second fence.

17. The apparatus of claim 1, wherein the planar portion of the conductive layer bridges a gap between the top surface of the fence and the top surface of the integrated circuit.

* * * * *